(12) United States Patent
Oishi (10) Patent No.: US 10,840,871 B2
(45) Date of Patent: Nov. 17, 2020

(54) MULTILAYER LC FILTER

(71) Applicant: Murata Manufacturing Co., Ltd., Nagaokakyo (JP)

(72) Inventor: Akihito Oishi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/268,523

(22) Filed: Feb. 6, 2019

(65) Prior Publication Data

US 2019/0173447 A1    Jun. 6, 2019

Related U.S. Application Data

(63) Continuation of application No. PCT/JP2017/026617, filed on Jul. 24, 2017.

(30) Foreign Application Priority Data

Aug. 17, 2016 (JP) .................. 2016-160224

(51) Int. Cl.
  *H03H 7/01*   (2006.01)
  *H03H 7/09*   (2006.01)
  *H01G 4/40*   (2006.01)
  *H01F 17/00*  (2006.01)
  *H03H 1/00*   (2006.01)

(52) U.S. Cl.
  CPC ....... *H03H 7/0115* (2013.01); *H01F 17/0013* (2013.01); *H01G 4/40* (2013.01); *H03H 1/00* (2013.01); *H03H 7/09* (2013.01); *H03H 7/1708* (2013.01); *H03H 7/1775* (2013.01); *H01F 2017/0026* (2013.01); *H03H 2001/0085* (2013.01)

(58) Field of Classification Search
  CPC . H03H 2001/0085; H03H 7/09; H03H 7/0115
  USPC .................................................. 333/175, 185
  See application file for complete search history.

(56) References Cited

U.S. PATENT DOCUMENTS

| 2002/0048872 | A1  | 4/2002 | Yamaguchi |
| 2011/0074526 | A1* | 3/2011 | Taniguchi ........... H01P 1/20345 333/185 |
| 2013/0154769 | A1  | 6/2013 | Masuda |
| 2016/0218690 | A1  | 7/2016 | Imamura |

FOREIGN PATENT DOCUMENTS

| EP | 2 009 787 A1  | 12/2008 |
| JP | 2002-076809 A | 3/2002  |
| JP | 2013-128232 A | 6/2013  |
| JP | 2016-139873 A | 8/2016  |
| WO | 2007/119356 A1| 10/2007 |

OTHER PUBLICATIONS

Official Communication issued in International Patent Application No. PCT/JP2017/026617, dated Oct. 3, 2017.

* cited by examiner

*Primary Examiner* — Rakesh B Patel
(74) *Attorney, Agent, or Firm* — Keating & Bennett, LLP (57) ABSTRACT

A multilayer LC filter includes one via conductor on a second edge side and two via conductors on a fourth edge side that are connected to line-shaped conductor patterns of a first inductor, and two via conductors on the second edge side and one via conductor on the fourth edge side that are connected to line-shaped conductor patterns of a second inductor, and the third to fifth inductors also have this same relationship.

11 Claims, 5 Drawing Sheets

MULTILAYER LC FILTER

CROSS REFERENCE TO RELATED APPLICATIONS

This application claims the benefit of priority to Japanese Patent Application No. 2016-160224 filed on Aug. 17, 2016 and is a Continuation Application of PCT Application No. PCT/JP2017/026617 filed on Jul. 24, 2017. The entire contents of each application are hereby incorporated herein by reference.

BACKGROUND OF THE INVENTION

1. Field of the Invention

The present invention relates to a multilayer LC filter that includes a plurality of LC resonators inside a multilayer body, and more specifically, to a multilayer LC filter in which the Q values of inductors included in LC resonators are large and that achieves improved insertion loss.

2. Description of the Related Art

A multilayer LC filter in which LC resonators including inductors and capacitors are formed inside a multilayer body formed by stacking a plurality of dielectric layers on top of one another is used in various electronic devices.

This type of multilayer LC filter is disclosed in WO2007/119356.

Figure 5:
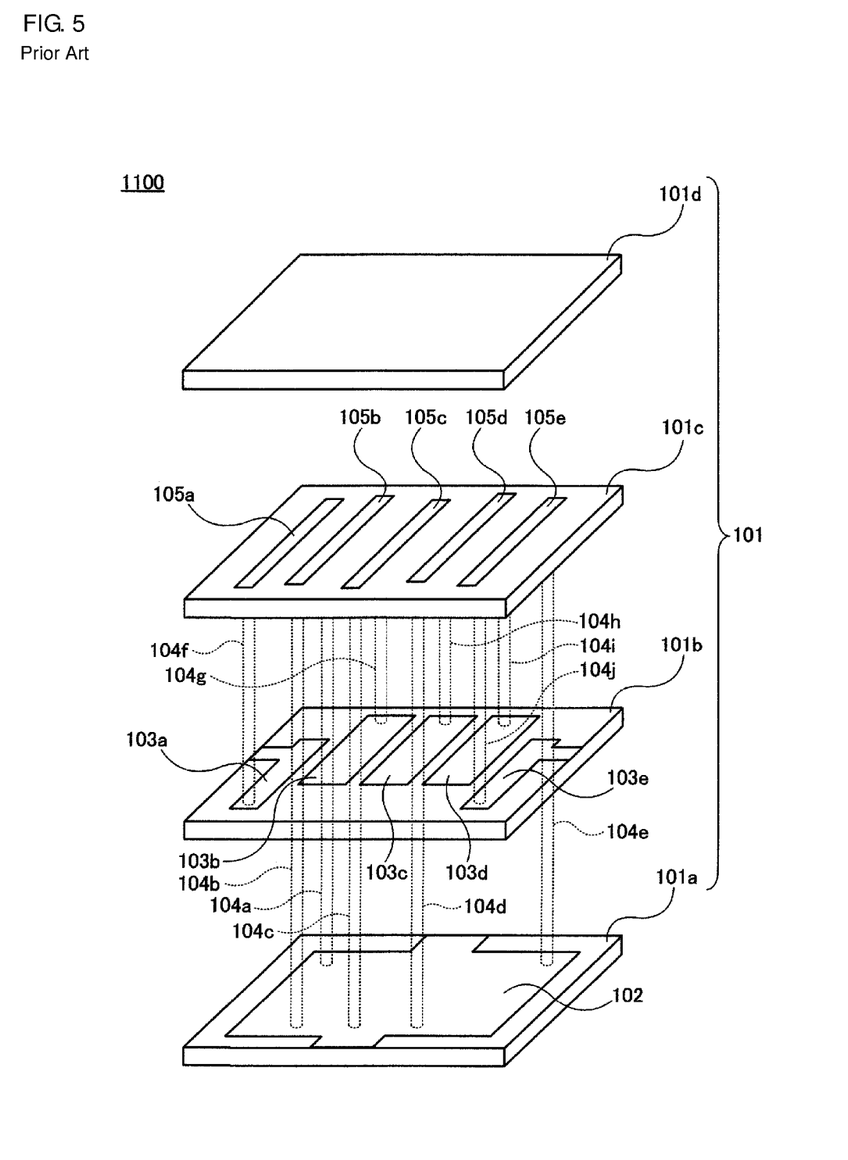
FIG. 5 is an exploded perspective view illustrating a multilayer LC filter 1100 disclosed in WO2007/119356.

FIG. 5 illustrates a multilayer LC filter (multilayer band pass filter) 1100 disclosed in WO2007/119356.

The multilayer LC filter 1100 includes a multilayer body 101 in which a plurality of dielectric layers are stacked that include a ground conductor pattern forming layer (ground electrode forming layer) 101a, a capacitor conductor pattern forming layer (capacitor electrode forming layer) 101b, a line-shaped conductor pattern forming layer (line electrode forming layer) 101c, and an outer layer 101d.

A ground conductor pattern (ground conductor pattern) 102 is formed on the upper main surface of the ground conductor pattern forming layer 101a. The ground conductor pattern 102 extends to ground terminals (ground terminals; not illustrated) formed on two opposing side surfaces of the multilayer body 101.

Five capacitor conductor patterns 103a to 103e are formed on the upper main surface of the capacitor conductor pattern forming layer 101b. Among these capacitor conductor patterns, the capacitor conductor patterns 103a and 103e extend to input/output terminals (not illustrated) formed on the other side surfaces on which the ground terminals are not formed.

In addition, five via conductors (via electrodes) 104a to 104e are formed in the capacitor conductor pattern forming layer 101b.

Five line-shaped conductor patterns 105a to 105e are formed on the upper main surface of the line-shaped conductor pattern forming layer 101c.

Furthermore, the previously mentioned five via conductors 104a to 104e are also formed in the line-shaped conductor pattern forming layer 101c. In addition, another five via conductors 104f to 104j are formed in the line-shaped conductor pattern forming layer 101c.

The outer layer 101d is a protective layer, and no conductor patterns or via conductors are formed on or in the outer layer 101d.

The via conductor 104f, the line-shaped conductor pattern 105a, and the via conductor 104a are connected to each other, and a loop-shaped first inductor is thus formed between the capacitor conductor pattern 103a and the ground conductor pattern 102. In addition, a first capacitor is formed by the capacitor conductor pattern 103a and the ground conductor pattern 102. The first inductor and the first capacitor are connected in parallel with each other, and a first LC parallel resonator is thus formed.

The via conductor 104g, the line-shaped conductor pattern 105b, and the via conductor 104b are connected to each other, and a loop-shaped second inductor is thus formed between the capacitor conductor pattern 103b and the ground conductor pattern 102. In addition, a second capacitor is formed by the capacitor conductor pattern 103b and the ground conductor pattern 102. The second inductor and the second capacitor are connected in parallel with each other, and a second LC parallel resonator is thus formed.

The via conductor 104h, the line-shaped conductor pattern 105c, and the via conductor 104c are connected to each other and a loop-shaped third inductor is thus formed between the capacitor conductor pattern 103c and the ground conductor pattern 102. In addition, a third capacitor is formed by the capacitor conductor pattern 103c and the ground conductor pattern 102. The third inductor and the third capacitor are connected in parallel with each other, and a third LC parallel resonator is thus formed.

The via conductor 104i, the line-shaped conductor pattern 105d, and the via conductor 104d are connected to each other and a loop-shaped fourth inductor is thus formed between the capacitor conductor pattern 103d and the ground conductor pattern 102. In addition, a fourth capacitor is formed by the capacitor conductor pattern 103d and the ground conductor pattern 102. The fourth inductor and the fourth capacitor are connected in parallel with each other, and a fourth LC parallel resonator is thus formed.

The via conductor 104j, the line-shaped conductor pattern 105e, and the via conductor 104e are connected to each other and a loop-shaped fifth inductor is thus formed between the capacitor conductor pattern 103e and the ground conductor pattern 102. In addition, a fifth capacitor is formed by the capacitor conductor pattern 103e and the ground conductor pattern 102. The fifth inductor and the fifth capacitor are connected in parallel with each other, and a fifth LC parallel resonator is thus formed.

As described above, the five first to fifth LC parallel resonators are formed inside the multilayer body 101 of the multilayer LC filter 1100. One input/output terminal of the multilayer LC filter 1100 is connected to the first LC parallel resonator and the other input/output terminal of the multilayer LC filter 1100 is connected to the fifth LC parallel resonator, and additionally the inductors of adjacent LC parallel resonators are electromagnetically coupled with each other, and a five-stage LC band pass filter is thus formed.

Thus, in the multilayer LC filter 1100, the inductors of a plurality of LC parallel resonators are formed of loops including via conductors and line-shaped conductor patterns, and when viewed in the direction in which the LC parallel resonators are arrayed, the loop surfaces of the coupled inductors of LC parallel resonators at least partially overlap, and therefore, the degree of coupling therebetween is high and an increase in the bandwidth of the filter characteristics is achieved.

It is desirable that the insertion loss of electronic components, including multilayer LC filters, be as small as possible in order to make it possible to reduce the power consumption of electronic devices. In particular, it is strongly demanded that electronic components used in electronic devices that are driven using a battery, such as mobile communication devices, have a small insertion loss.

However, in the multilayer LC filter 1100 disclosed in WO2007/119356, the inductors of the LC resonators have a simple configuration in which the average sectional area is small and include via conductors provided close to a side surface of the rectangular parallelepiped shaped multilayer body located on one long edge side of the multilayer body, via conductors provided close to a side surface of the multilayer body located on the other long edge side of the multilayer body, and line-shaped conductor patterns having a width that is substantially the same as the via diameters of both these sets of via conductors. Therefore, the internal resistances of the inductors are comparatively large, the Q values of the inductors are comparatively inadequate, and there is a risk of the demanded small insertion loss not being obtained.

SUMMARY OF THE INVENTION

Preferred embodiments of the present invention provide an improvement of the Q values of LC resonators and reduce the insertion loss of multilayer LC filters that each include LC resonators including loop-shaped inductors that include via conductors as in WO2007/119356.

A multilayer LC filter according to a preferred embodiment of the present invention includes a rectangular-parallelepiped-shaped multilayer body including a plurality of dielectric layers that are stacked on top of one another; a plurality of line-shaped conductor patterns provided between the dielectric layers; a plurality of capacitor conductor patterns provided between the dielectric layers; at least one ground conductor pattern provided between the dielectric layers; and a plurality of via conductors penetrating through the dielectric layers. The via conductors are connected to both ends of the line-shaped conductor patterns, and thus a plurality of loop-shaped inductors are provided. A plurality of capacitors are each provided by a capacitance between a capacitor conductor pattern and the ground conductor pattern or by a capacitance between a pair of the capacitor conductor patterns. At least two LC resonators are provided as a result of the inductors and the capacitors being connected to each other. The multilayer body includes a first edge, a second edge, a third edge, and a fourth edge, which are consecutively connected to each other, when viewed in a stacking direction of the dielectric layers. In a transparent view of the multilayer body in the stacking direction of the dielectric layers, the via conductors are connected to the line-shaped conductor patterns of the plurality of LC resonators at the second edge side and the fourth edge side of the multilayer body, and different numbers of via conductors are connected to the second edge side and the fourth edge side of at least one of the line-shaped conductor patterns.

It is preferable that the multilayer LC filter is configured such that among the consecutively arrayed LC resonators, when any two or more of the consecutively arrayed LC resonators from a first LC resonator to an Nth LC resonator are viewed, among first and second LC resonators, a greater number of the via conductors are connected to the fourth edge sides than to the second edge sides of the line-shaped conductor patterns of one of the LC resonators, and a greater number of the via conductors are connected to the second edge sides than to the fourth edge sides of the line-shaped conductor patterns of the other LC resonator, the via conductors are connected to the line-shaped conductor patterns of odd-numbered LC resonators in the same or substantially the same manner as in the first LC resonator and the via conductors are connected to the line-shaped conductor patterns of even-numbered LC resonators in the same or substantially the same manner as in the second LC resonator in the third to Nth LC resonators. N is an integer greater than or equal to 2. In this case, the internal resistances are able to be reduced, the Q values of the inductors are able to be increased, and the insertion loss of the multilayer LC filter is able to be reduced by increasing the number of via conductors while reducing or preventing an increase in size.

It is further preferable that the multilayer LC filter includes N LC resonators provided inside the multilayer body, when all of the LC resonators, which are consecutively arrayed from a first LC resonator to an Nth LC resonator, are viewed, among the first and second LC resonators, a greater number of the via conductors are connected to the fourth edge sides than to the second edge sides of the line-shaped conductor patterns of one of the LC resonators, and a greater number of via conductors are connected to the second edge sides than to the fourth edge sides of the line-shaped conductor patterns of the other LC resonator, and the via conductors are connected to the line-shaped conductor patterns of odd-numbered LC resonators in the same or substantially the same manner as in the first LC resonator, and the via conductors are connected to the line-shaped conductor patterns of even-numbered LC resonators in the same or substantially the same manner as in the second LC resonator in the third to Nth LC resonators. When via conductors are connected to line-shaped conductor patterns in this manner for all of the LC resonators provided inside the multilayer LC filter, it is possible to more effectively reduce the internal resistances, increase the Q values of the inductors, and reduce the insertion loss of the multilayer LC filter by increasing the number of via conductors while reducing or preventing an increase in size.

The multilayer LC filter is preferably configured such that among the first and second LC resonators, one via conductor is connected to the second edge side and two via conductors are connected to the fourth edge side of each line-shaped conductor pattern of one of the first and second LC resonators, and two via conductors are connected to the second edge side and one via conductor is connected to the fourth edge side of each line-shaped conductor pattern of the other of the first and second LC resonators. In this case as well, it is possible to more effectively reduce the internal resistances, increase the Q values of inductors, and reduce the insertion loss of the multilayer LC filter by increasing the number of via conductors while reducing or preventing an increase in size.

The multilayer LC filter is preferably configured such that the line-shaped conductor patterns of the first and second LC resonators each include an edge that is not parallel to any of the first to fourth edges of the multilayer body. In this case as well, it is possible to more effectively reduce the internal resistances of the line-shaped conductor patterns, increase the Q values of inductors, and reduce the insertion loss of the multilayer LC filter while reducing or preventing an increase in size.

In addition, the multilayer LC filter is preferably configured such that the inductors of adjacent LC resonators are electromagnetically coupled with each other, and in a transparent view of a side surface of the multilayer body in a direction from the first edge toward the third edge, winding directions of the inductors of all the LC resonators are the same as each other. In this case, the electromagnetic coupling between the inductors of adjacent LC resonators is able to be strengthened, and a multilayer LC filter is able to be obtained that has broader frequency characteristics.

Alternatively, the multilayer LC filter is preferably configured such that the inductors of adjacent LC resonators are electromagnetically coupled with each other, and in a transparent view of a side surface of the multilayer body in a direction from the first edge toward the third edge, winding directions of the inductors of some of the LC resonators and winding directions of the inductors of remaining LC resonators are different from each other. In this case, the electromagnetic coupling between the inductors of some adjacent LC resonators is able to be strengthened, and a multilayer LC filter is able to be obtained that has desired frequency characteristics.

In multilayer LC filters according to preferred embodiments of the present invention, the internal resistances of inductors of LC resonators are reduced, the Q values of the inductors are increased, and the insertion loss of the multilayer LC filter is reduced while reducing or preventing an increase in size as much as possible.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described with reference to the drawings.

The preferred embodiments described below illustrate non-limiting examples of the present invention, and the present invention is not limited to the preferred embodiments. In addition, the drawings are to aid understanding of the specification and may be drawn in a schematic manner, and the dimensional ratios between the elements may not match the corresponding dimensional ratios described in the specification. In addition, elements described in the specification may be omitted from the drawings, may be drawn as being fewer in number, and other variations.

Figure 1:
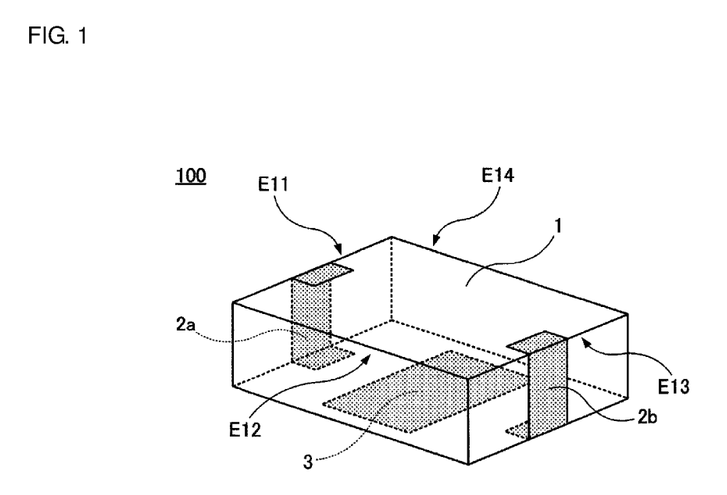
FIG. 1 is a perspective view illustrating a multilayer LC filter 100 according to a preferred embodiment of the present invention.
Figure 2:
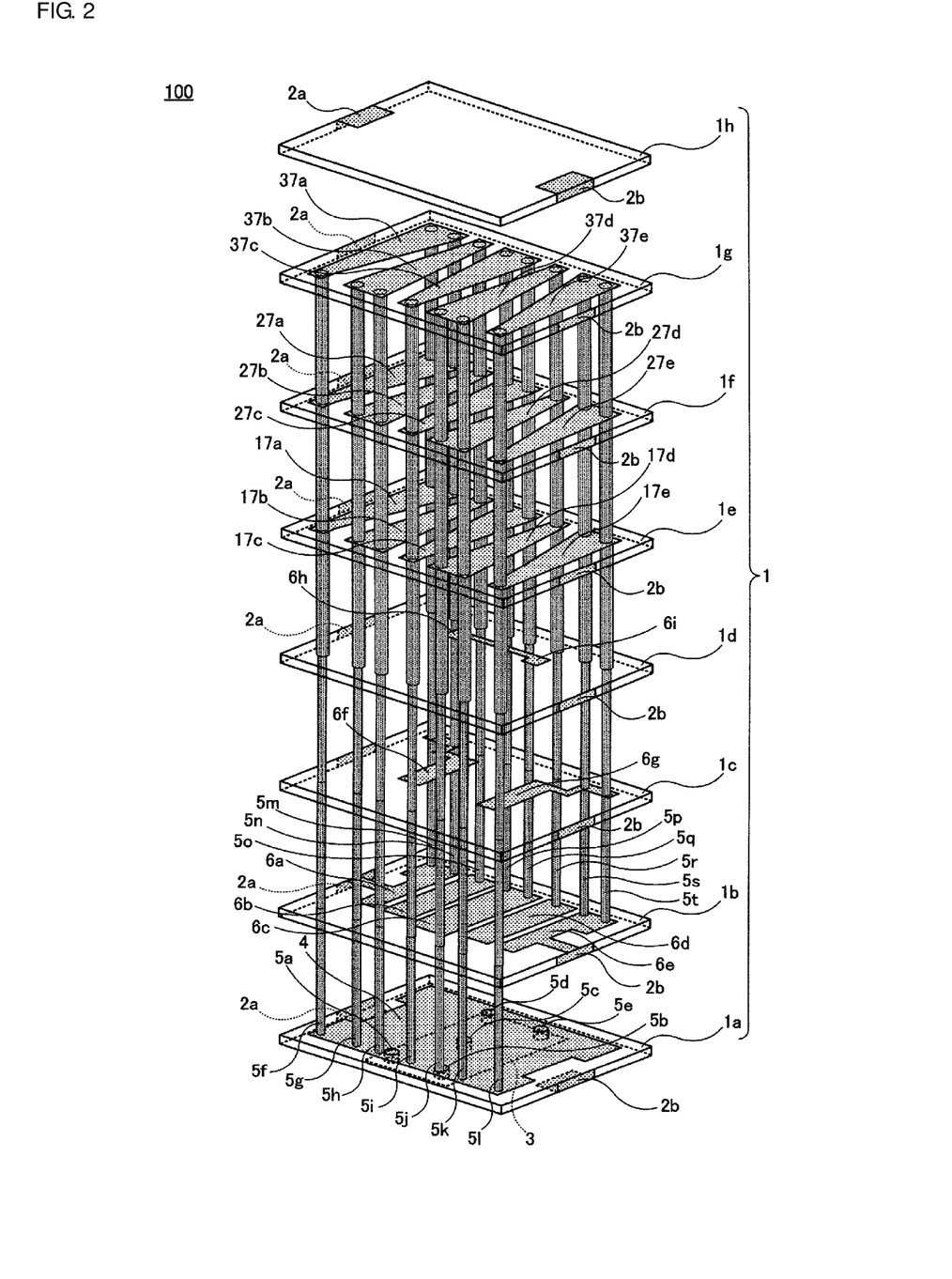
FIG. 2 is an exploded perspective view illustrating the multilayer LC filter 100.
Figure 3:
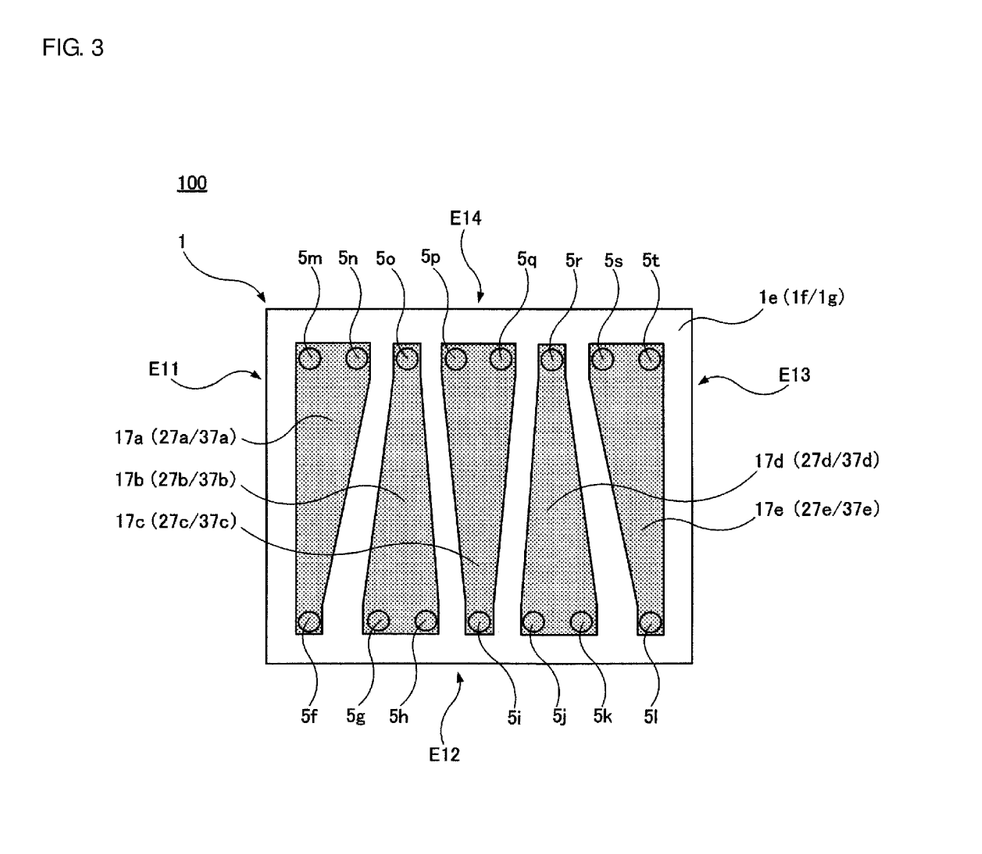
FIG. 3 is an exploded partial plan view illustrating the multilayer LC filter 100.
Figure 4:
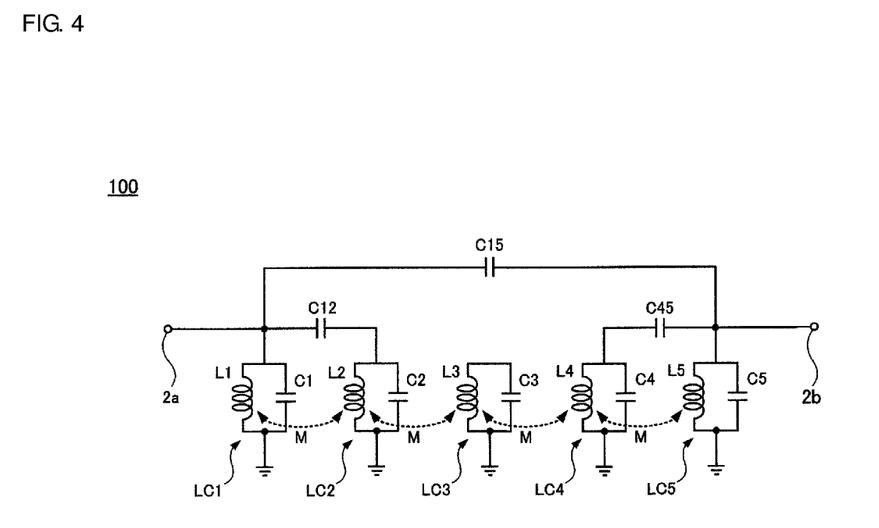
FIG. 4 is an equivalent circuit diagram of the multilayer LC filter 100.

FIGS. 1 to 4 illustrate a multilayer LC filter 100 according to a preferred embodiment of the present invention. FIG. 1 is a perspective view, FIG. 2 is an exploded perspective view, FIG. 3 is an exploded partial plan view, and FIG. 4 is an equivalent circuit diagram.

The multilayer LC filter 100 includes a multilayer body 1.

An input/output terminal 2a and an input/output terminal 2b are provided on opposing side surfaces (end surfaces) of the multilayer body 1. One end of the input/output terminal 2a and one end of the input/output terminal 2b extend onto a lower main surface of the multilayer body 1, and the other end of the input/output terminal 2a and the other end of the input/output terminal 2b extend onto an upper main surface of the multilayer body 1. In addition, a ground terminal 3 is provided on the lower main surface of the multilayer body 1.

As illustrated in FIG. 2, the multilayer body 1 includes eight dielectric layers 1a to 1h that are consecutively stacked from the bottom, and are preferably made of a ceramic, for example.

As illustrated in FIGS. 1 to 3, the multilayer body 1 includes a first edge E11, a second edge E12, a third edge E13, and a fourth edge E14, which are sequentially connected to each other, when viewed in the stacking direction of the dielectric layers 1a to 1h.

Hereafter, first, the dielectric layers 1a to 1h included in the multilayer body 1 will be described.

The input/output terminal 2a and the input/output terminal 2b are provided on opposing side surfaces (end surfaces) of the dielectric layer 1a. The input/output terminals 2a and 2b are also provided on the opposing side surfaces of the dielectric layers 1b to 1h described hereafter, but description thereof is omitted when not particularly necessary.

The ground terminal 3 is provided on the lower main surface of the dielectric layer 1a.

Five via conductors 5a to 5e penetrate between the upper and lower main surfaces of the dielectric layer 1a.

A ground conductor pattern 4 is provided on the upper main surface of the dielectric layer 1a. The ground conductor pattern 4 is connected to the ground terminal 3 by the via conductors 5a to 5e.

Seven via conductors 5f to 5l penetrate between the upper and lower main surfaces of the dielectric layer 1b. In FIG. 2, which is an exploded perspective view, the via conductors 5f to 5j are shown as extending further downward than in reality in order to facilitate understanding of the connection relationships (the same is also true for other via conductors described hereafter). The via conductors 5f to 5l are connected to the ground conductor pattern 4.

Five capacitor conductor patterns 6a to 6e are provided on the upper main surface of the dielectric layer 1b. The capacitor conductor pattern 6a is connected to the input/output terminal 2a. The capacitor conductor pattern 6e is connected to the input/output terminal 2b.

Seven via conductors 5f to 5l penetrate between the upper and lower main surfaces of the dielectric layer 1c. Via conductors 5f to 5l are also provided in the dielectric layer 1b as described above. When via conductors are provided in different layers and denoted by the same symbols, this indicates that the via conductors denoted by the same symbols are respectively connected to each other. Eight via conductors 5m to 5t penetrate between the upper and lower main surfaces of the dielectric layer 1c. The via conductors 5m and 5n are connected to the capacitor conductor pattern 6a. The via conductor 5o is connected to the capacitor conductor pattern 6b. The via conductors 5p and 5q are connected to the capacitor conductor pattern 6c. The via conductor 5r is connected to the capacitor conductor pattern 6d. The via conductors 5s and 5t are connected to the capacitor conductor pattern 6e.

Two capacitor conductor patterns 6f and 6g are provided on the upper main surface of the dielectric layer 1c. The capacitor conductor pattern 6f is connected to the via conductors 5m and 5n. In addition, the capacitor conductor pattern 6g is connected to the via conductors 5s and 5t.

Seven via conductors 5f to 5l and eight via conductors 5m to 5t penetrate between the upper and lower main surfaces of the dielectric layer 1d.

Two capacitor conductor patterns 6h and 6i are provided on the upper main surface of the dielectric layer 1d. The capacitor conductor pattern 6h and the capacitor conductor pattern 6i are connected to each other.

Seven via conductors 5f to 5l and eight via conductors 5m to 5t penetrate between the upper and lower main surfaces of the dielectric layer 1e.

Five line-shaped conductor patterns 17a to 17e are provided on the upper main surface of the dielectric layer 1e. The upper main surface of the dielectric layer 1e is illustrated in FIG. 3. The line-shaped conductor patterns 17a to 17e extend in the same or substantially the same direction as the opposing first edge E11 and third edge E13. The line-shaped conductor patterns 17a to 17e are disposed such that the opposing long edges thereof are not parallel to each other. As a result, the line-shaped conductor patterns 17a to 17e each include at least one edge that is not parallel to any of the first edge E11, the second edge E12, the third edge E13, and the fourth edge E14 of the multilayer body 1.

One via conductor 5f is connected to an end portion of the line-shaped conductor pattern 17a located on the second edge E12 side, and two via conductors 5m and 5n are connected to an end portion of the line-shaped conductor pattern 17a located on the fourth edge E14 side. Two via conductors 5g and 5h are connected to an end portion of the line-shaped conductor pattern 17b located on the second edge E12 side, and one via conductor 5o is connected to an end portion of the line-shaped conductor pattern 17b located on the fourth edge E14 side. One via conductor 5i is connected to an end portion of the line-shaped conductor pattern 17c located on the second edge E12 side, and two via conductors 5p and 5q are connected to an end portion of the line-shaped conductor pattern 17c that is on the fourth edge E14 side. Two via conductors 5j and 5k are connected to an end portion of the line-shaped conductor pattern 17d located on the second edge E12 side, and one via conductor 5r is connected to an end portion of the line-shaped conductor pattern 17d located on the fourth edge E14 side. One via conductor 5l is connected to an end portion of the line-shaped conductor pattern 17e located on the second edge E12 side, and two via conductors 5s and 5t are connected to an end portion of the line-shaped conductor pattern 17e located on the fourth edge E14 side.

As described above, a total of seven via conductors 5f to 5l are connected to the end portions of the line-shaped conductor patterns 17a to 17e located on the second edge E12 side, the number of via conductors alternating between 1, 2, 1, 2, and 1, and a total of eight via conductors 5m to 5t are connected to the end portions of the line-shaped conductor patterns 17a to 17e located on the fourth edge E14 side, the number of via conductors alternating between 2, 1, 2, 1, and 2. That is, space is utilized as effectively as possible in the multilayer LC filter 100, and the internal resistance is reduced by connecting as many via conductors 5f to 5t as possible to the line-shaped conductor patterns 17a to 17e.

Seven via conductors 5f to 5l and eight via conductors 5m to 5t, for example, preferably penetrate between the upper and lower main surfaces of the dielectric layer 1f.

Five line-shaped conductor patterns 27a to 27e, for example, are preferably provided on the upper main surface of the dielectric layer 1f.

As illustrated in FIG. 3, the line-shaped conductor patterns 27a to 27e respectively have the same or substantially the same shapes as the line-shaped conductor patterns 17a to 17e provided on the upper main surface of the dielectric layer 1e. In addition, via conductors 5f to 5t are connected to the line-shaped conductor patterns 27a to 27e at the same or substantially the same positions as in the case of the line-shaped conductor patterns 17a to 17e.

Seven via conductors 5f to 5l and eight via conductors 5m to 5t, for example, preferably penetrate between the upper and lower main surfaces of the dielectric layer 1g.

Five line-shaped conductor patterns 37a to 37e, for example, are preferably provided on the upper main surface of the dielectric layer 1g. As illustrated in FIG. 3, the line-shaped conductor patterns 37a to 37e respectively have the same or substantially the same shapes as the line-shaped conductor patterns 17a to 17e provided on the upper main surface of the dielectric layer 1e. In addition, via conductors 5f to 5t are connected to the line-shaped conductor patterns 37a to 37e at the same or substantially the same positions as in the case of the line-shaped conductor patterns 17a to 17e.

The dielectric layer 1h is a protective layer. The input/output terminal 2a and the input/output terminal 2b are provided on opposing side surfaces (end surfaces) of the dielectric layer 1h.

The multilayer LC filter 100 having the above-described structure is able to be manufactured using materials and manufacturing methods widely used for multilayer LC filters of the related art.

The multilayer LC filter 100 includes the equivalent circuit illustrated in FIG. 4.

In the multilayer LC filter 100, a first LC parallel resonator LC1 in which a first inductor L1 and a first capacitor C1 are connected in parallel with each other, a second LC parallel resonator LC2 in which a second inductor L2 and a second capacitor C2 are connected in parallel with each other, a third LC parallel resonator LC3 in which a third inductor L3 and a third capacitor C3 are connected in parallel with each other, a fourth LC parallel resonator LC4 in which a fourth inductor L4 and a fourth capacitor C4 are connected in parallel with each other, and a fifth LC parallel resonator LC5 in which a fifth inductor L5 and a fifth capacitor C5 are connected in parallel with each other are sequentially disposed between the input/output terminal 2a and the input/output terminal 2b. The inductor L1 and the inductor L2, the inductor L2 and the inductor L3, the inductor L3 and the inductor L4, and the inductor L4 and the inductor L5 are respectively electromagnetically coupled with each other. In addition, the first LC parallel resonator LC1 and the second LC parallel resonator LC2 are capacitively coupled with each other via a capacitor C12. The fourth LC parallel resonator LC4 and the fifth LC parallel resonator LC5 are capacitively coupled with each other via a capacitor C45. The first LC parallel resonator LC1 and the fifth LC parallel resonator LC5 are capacitively coupled with each other via a capacitor C15.

The multilayer LC filter 100 including the above-described equivalent circuit defines a band pass filter in which five LC parallel resonators are provided between the input/output terminal 2a and the input/output terminal 2b and that has desired frequency characteristics.

Next, the relationship between the structure and the equivalent circuit of the multilayer LC filter 100 will be described.

First, the loop-shaped first inductor L1 is provided by connecting one via conductor 5f to the end portions of the line-shaped conductor patterns 17a, 27a, and 37a located on the second edge E12 side, and by connecting two via conductors 5m and 5n to the end portions of the line-shaped conductor patterns 17a, 27a, and 37a located on the fourth edge E14 side. In addition, the first capacitor C1 is defined by a capacitance between the capacitor conductor pattern 6a and the ground conductor pattern 4. The capacitor conductor pattern 6a is connected to the input/output terminal 2a as described above. The first inductor L1 and the first capacitor C1 are connected in parallel with each other as a result of the via conductor 5f being connected to the ground conductor pattern 4, and the first LC parallel resonator LC1 is thus provided.

The line-shaped conductor patterns of the first inductor L1 are provided, for example, on 3 layers, namely, the line-shaped conductor patterns 17a, 27a, and 37a. The internal resistance of a line-shaped conductor pattern is able to be reduced by structuring the line-shaped conductor pattern to include a plurality of layers. Structuring the line-shaped conductor pattern of the first inductor L1 to include the three layers of the line-shaped conductor patterns 17a, 27a, and 37a and reducing the internal resistance contributes to increasing the Q value of the inductor L1. The line-shaped conductor patterns of the second to fifth inductors L2 to L5 described later also include a plurality of layers of line-shaped conductor patterns for the same reason.

The loop-shaped second inductor L2 is provided by connecting two via conductors 5g and 5h to the end portions of the line-shaped conductor patterns 17b, 27b, and 37b located on the second edge E12 side, and by connecting one via conductor 5o to the end portions of the line-shaped conductor patterns 17b, 27b, and 37b located on the fourth edge E14 side. In addition, the second capacitor C2 is defined by a capacitance between the capacitor conductor pattern 6b and the ground conductor pattern 4. The second inductor L2 and the second capacitor C2 are connected in parallel with each other as a result of the via conductors 5g and 5h being connected to the ground conductor pattern 4, and the second LC parallel resonator LC2 is thus provided.

The loop-shaped third inductor L3 is provided by connecting one via conductor 5i to the end portions of the line-shaped conductor patterns 17c, 27c, and 37c located on the second edge E12 side, and by connecting two via conductors 5p and 5q to the end portions of the line-shaped conductor patterns 17c, 27c, and 37c located on the fourth edge E14 side. In addition, the third capacitor C3 is defined by a capacitance between the capacitor conductor pattern 6c and the ground conductor pattern 4. The third inductor L3 and the third capacitor C3 are connected in parallel with each other as a result of the via conductor 5i being connected to the ground conductor pattern 4, and the third LC parallel resonator LC3 is thus provided.

The loop-shaped fourth inductor L4 is provided by connecting two via conductors 5j and 5k to the end portions of the line-shaped conductor patterns 17d, 27d, and 37d located on the second edge E12 side, and by connecting one via conductor 5r to the end portions of the line-shaped conductor patterns 17d, 27d, and 37d located on the fourth edge E14 side. In addition, the fourth capacitor C4 is defined by a capacitance between the capacitor conductor pattern 6d and the ground conductor pattern 4. The fourth inductor L4 and the fourth capacitor C4 are connected in parallel with each other as a result of the via conductors 5j and 5k being connected to the ground conductor pattern 4, and the fourth LC parallel resonator LC4 is thus provided.

The loop-shaped fifth inductor L5 is provided by connecting one via conductor 5l to the end portions of the line-shaped conductor patterns 17e, 27e, and 37e located on the second edge E12 side, and by connecting two via conductors 5s and 5t to the end portions of the line-shaped conductor patterns 17e, 27e, and 37e located on the fourth edge E14 side. In addition, the fifth capacitor C5 is defined by a capacitance between the capacitor conductor pattern 6e and the ground conductor pattern 4. The capacitor conductor pattern 6e is connected to the input/output terminal 2b as described above. The fifth inductor L5 and the fifth capacitor C5 are connected in parallel with each other as a result of the via conductor 5l being connected to the ground conductor pattern 4, and the fifth LC parallel resonator LC5 is thus provided.

In addition, the capacitor C12 is defined by a capacitance between the capacitor conductor pattern 6f and the capacitor conductor pattern 6b. As described above, the capacitor conductor pattern 6f is connected to the via conductors 5m and 5n. In addition, the capacitor conductor pattern 6b also defines and functions as a conductor pattern of the second capacitor C2.

In addition, the capacitor C45 is defined by a capacitance between the capacitor conductor pattern 6g and the capacitor conductor pattern 6d. As described above, the capacitor conductor pattern 6g is connected to the via conductors 5s and 5t. In addition, the capacitor conductor pattern 6d also defines and functions as a conductor pattern of the fourth capacitor C4.

The capacitor C15 is defined by a capacitance between the capacitor conductor pattern 6f and the capacitor conductor pattern 6h and a capacitance between the capacitor conductor pattern 6g and the capacitor conductor pattern 6i. As described above, the capacitor conductor pattern 6f is connected to the via conductors 5m and 5n, the capacitor conductor pattern 6h and the capacitor conductor pattern 6i are connected to each other, and the capacitor conductor pattern 6g is connected to the via conductors 5s and 5t.

According to the above-described structural relationships, the multilayer LC filter 100 includes the equivalent circuit illustrated in FIG. 4 inside the multilayer body 1.

As illustrated in FIG. 3, in the multilayer LC filter 100, one via conductor 5f is connected to the second edge E12 sides of the line-shaped conductor patterns 17a, 27a, and 37a of the first inductor L1 and two via conductors 5m and 5n are connected to the fourth edge E14 sides of the line-shaped conductor patterns 17a, 27a, and 37a of the first inductor L1, and conversely, two via conductors 5g and 5f are connected to the second edge E12 sides of the line-shaped conductor patterns 17b, 27b, and 37b of the second inductor L2 and one via conductor 5o is connected to the fourth edge E14 sides of the line-shaped conductor patterns 17b, 27b, and 37b of the second inductor L2, and thereafter these same relationships are repeated for the third to fifth inductors L3 to L5, and as a result, effective use is made of the limited space inside the multilayer body 1 and the internal resistances of the inductors L1 to L5 are reduced, the Q values of the inductors L1 to L5 are increased, and the insertion loss between the input/output terminals 2a and 2b is effectively reduced by increasing the number of via conductors while reducing or preventing an increase in size.

Furthermore, in the multilayer LC filter 100, the line-shaped conductor patterns 17a to 17e, 27a to 27e, and 37a to 37e are disposed such that opposing long edges thereof are not parallel to each other, and the surface areas of the line-shaped conductor patterns are able to be made as large as possible in the limited space. Structuring the line-shaped conductor patterns 17a to 17e, 27a to 27e, and 37a to 37e in this manner such that the opposing long edges thereof are not parallel to each other also contributes to reducing the internal resistances of the line-shaped conductor patterns and increasing the Q values of the inductors L1 to L5.

In addition, in a transparent view of a side wall of the multilayer body 1 of the multilayer LC filter 100 in a direction from the first edge E11 toward the third edge E13, the winding directions of all of the inductors L1 to L5 of the LC parallel resonators LC1 to LC5 are preferably the same as each other. As a result, in the multilayer LC filter 100, the electromagnetic coupling between the inductors of adjacent LC parallel resonators is strengthened and broader frequency characteristics are realized. In the case in which it is preferable to provide a band that is narrower than that of the frequency characteristics of the multilayer LC filter 100, the winding directions of some of the inductors L1 to L5 may be reversed.

The multilayer LC filter 100 according to the present preferred embodiment has been described. However, the present invention is not limited to the above-described structure and configuration and may be modified in various ways within the scope of the present invention.

For example, the multilayer LC filter 100 is preferably a 5-stage band pass filter that includes the 5 LC parallel resonators LC1 to LC5, for example, but multilayer LC filters according to preferred embodiments of the present invention are not limited to being a band pass filter and may be another type of filter, such as a high pass filter or a low pass filter, for example. In addition, LC resonators provided inside multilayer LC filters according to preferred embodiments of the present invention are not limited to being LC parallel resonators, and may instead be LC series resonators, for example. Furthermore, the number of stages of multilayer LC filters according to preferred embodiments of the present invention is not limited to 5 stages, and may be smaller or larger than 5.

In addition, in the multilayer LC filter 100, 1, 2, 1, 2, and 1 via conductors 5f to 5l are connected to the end portions of the line-shaped conductor patterns 17a to 17e (27a to 27e, 37a to 37e) located on the second edge E12 side, and 2, 1, 2, 1, and 2 via conductors 5m to 5t are connected to the end portions of the line-shaped conductor patterns 17a to 17e (27a to 27e, 37a to 37e) located on fourth edge E14 side, but these numbers may be changed in accordance with the application of preferred embodiments of the present invention. For example, 2, 3, 2, 3, and 2 via conductors may be connected to the end portions located on the second edge E12 side, and 3, 2, 3, 2, and 3 via conductors may be connected to the end portions located on the fourth edge E14 side. Alternatively, 1, 3, 1, 3, and 1 via conductors may be connected to the end portions located on the second edge E12 side, and 3, 1, 3, 1, and 3 via conductors may be connected to the end portions located on the fourth edge E14 side.

In addition, in the multilayer LC filter 100, a connection structure of via conductors to line-shaped conductor patterns is provided for all of the LC resonators (LC parallel resonators LC1 to LC5) provided inside the multilayer body 1, but the connection structure of via conductors to line-shaped conductor patterns may instead be used for just some LC resonators that are adjacent to each other and are provided inside the multilayer body 1. However, when the connection structure of via conductors to line-shaped conductor patterns is provided for all of the LC resonators, it is possible to more effectively reduce the insertion loss of the multilayer LC filter while reducing or preventing an increase in size.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer LC filter comprising:
a multilayer body including a plurality of dielectric layers that are stacked on top of one another;
a plurality of line-shaped conductor patterns provided between the plurality of dielectric layers;
a plurality of capacitor conductor patterns provided between the plurality of dielectric layers;
at least one ground conductor pattern provided between the plurality of dielectric layers; and
a plurality of via conductors penetrating through the plurality of dielectric layers; wherein
the plurality of via conductors are connected to two ends of the plurality of line-shaped conductor patterns to define a plurality of loop-shaped inductors;
a plurality of capacitors are each defined by a capacitance between a capacitor conductor pattern of the plurality of capacitor conductor patterns and the at least one ground conductor pattern or by a capacitance between a pair of the plurality of capacitor conductor patterns;
at least two LC resonators are defined by the plurality of loop-shaped inductors and the plurality of capacitors being connected to each other;
the multilayer body includes a first edge, a second edge, a third edge, and a fourth edge, that are consecutively connected to each other, when viewed in a stacking direction of the plurality of dielectric layers;
in a transparent view of the multilayer body in the stacking direction of the plurality of dielectric layers:
the plurality of via conductors are connected to the plurality of line-shaped conductor patterns of the plurality of LC resonators at the second edge side and the fourth edge side of the multilayer body;
the plurality of line-shaped conductor patterns include a first line-shaped conductor pattern to which the plurality of via conductors are connected at the second edge side and the fourth edge side of the multilayer body; and
a number of the plurality of via conductors connected to the first line-shaped conductor pattern at the second edge side of the multilayer body is different from a number of the plurality of via conductors connected to the first line-shaped conductor pattern at the fourth edge side of the multilayer body.

2. The multilayer LC filter according to claim 1, wherein among consecutively arrayed LC resonators of the at least two LC resonators, when any two or more of the consecutively arrayed LC resonators from a first LC resonator to an Nth LC resonator are viewed, among the first LC resonator and the second LC resonator, a greater number of the plurality of via conductors are connected to the fourth edge sides than to the second edge sides of the line-shaped conductor patterns of one of first and second LC resonators;
a greater number of the plurality of via conductors are connected to the second edge sides than to the fourth edge sides of the line-shaped conductor patterns of another one of the first and second LC resonators; and
the plurality of via conductors are connected to the line-shaped conductor patterns of odd-numbered LC resonators in a same or substantially same manner as in the first LC resonator, and the via conductors are connected to the line-shaped conductor patterns of even-numbered LC resonators in a same or substantially same manner as in the second LC resonator, where N is an integer greater than or equal to 2.

3. The multilayer LC filter according to claim 2, wherein the line-shaped conductor patterns of the first LC resonator each include an edge that is not parallel to an opposing edge of the second LC resonator.

4. The multilayer LC filter according to claim 2, wherein among the first and second LC resonators, one via conductor is connected to the second edge side and two via conductors are connected to the fourth edge side of each line-shaped conductor pattern of the one of the first and second LC resonators, and two via conductors are connected to the second edge side and one via conductor is connected to the fourth edge side of each line-shaped conductor pattern of the another one of the first and second LC resonators.

5. The multilayer LC filter according to claim 2, wherein the line-shaped conductor patterns of the first and second LC resonators each include an edge that is not parallel to any of the first to fourth edges of the multilayer body.

6. The multilayer LC filter according to claim 1, wherein
the inductors of adjacent LC resonators of the at least two LC resonators are electromagnetically coupled with each other; and
in a transparent view of a side surface of the multilayer body in a direction from the first edge toward the third edge, winding directions of the inductors of all of the LC resonators are identical to each other.

7. The multilayer LC filter according to claim 1, wherein
the inductors of adjacent LC resonators of the at least two LC resonators are electromagnetically coupled with each other; and
in a transparent view of a side surface of the multilayer body in a direction from the first edge toward the third edge, a winding direction of the inductor of at least one of the at least two LC resonators and a winding direction of the inductor of at least another one of the at least two LC resonators are different from each other.

8. The multilayer LC filter according to claim 1, wherein input/output terminals are provided on opposing side surfaces of the multilayer body.

9. The multilayer LC filter according to claim 1, wherein
the at least two LC resonators include N LC resonators provided inside the multilayer body;
when all of the N LC resonators, which are consecutively arrayed from a first LC resonator to an Nth LC resonator, are viewed: among the first LC resonator and the second LC resonator, a greater number of the plurality of via conductors are connected to the fourth edge sides than to the second edge sides of the line-shaped conductor patterns of one of the first and second LC resonators, and a greater number of via conductors are connected to the second edge sides than to the fourth edge sides of the line-shaped conductor patterns of another one of the first and second LC resonators; and
the via conductors are connected to the line-shaped conductor patterns of odd-numbered LC resonators in a same or substantially same manner as in the first LC resonator and the via conductors are connected to the line-shaped conductor patterns of even-numbered LC resonators in a same or substantially same manner as in the second LC resonator in the third to Nth LC resonators, where N is equal to or greater than 4.

10. The multilayer LC filter according to claim 1, wherein the at least one ground conductor pattern is disposed on a lowermost dielectric layer of the plurality of dielectric layers.

11. The multilayer LC filter according to claim 1, wherein the multilayer body has a rectangular or substantially rectangular parallelepiped shape.

* * * * *